United States Patent [19]

Eda et al.

[11] Patent Number: 5,771,555
[45] Date of Patent: Jun. 30, 1998

[54] METHOD FOR PRODUCING AN ELECTRONIC COMPONENT USING DIRECT BONDING

[75] Inventors: Kazuo Eda, Nara; Yoshihiro Tomita, Osaka; Akihiro Kanaboshi, Higashiosaka; Masato Sugimoto, Kadoma, all of Japan

[73] Assignee: Matsushita Electric Industrial Co., Ltd., Osaka, Japan

[21] Appl. No.: 433,687

[22] Filed: May 4, 1995

Related U.S. Application Data

[62] Division of Ser. No. 333,210, Nov. 1, 1994.

[30] Foreign Application Priority Data

Nov. 1, 1993 [JP] Japan .................................. 5-273501

[51] Int. Cl.$^6$ .................................................. H01L 41/22
[52] U.S. Cl. ........................ 29/25.35; 310/344; 310/348
[58] Field of Search .......................... 29/25.35; 310/344, 310/346, 340, 348, 320, 321

[56] References Cited

U.S. PATENT DOCUMENTS

| | | |
|---|---|---|
| 2,268,365 | 12/1941 | Willard . |
| 2,907,680 | 10/1959 | Smith et al. . |
| 3,397,278 | 8/1968 | Pomerantz . |
| 4,009,516 | 3/1977 | Chiang et al. ..................... 29/25.35 X |
| 4,191,905 | 3/1980 | Yasuda et al. . |
| 4,266,156 | 5/1981 | Kizaki . |
| 4,270,105 | 5/1981 | Parker et al. . |
| 4,293,986 | 10/1981 | Kobayashi et al. . |
| 4,362,961 | 12/1982 | Gerber . |
| 4,464,598 | 8/1984 | Besson et al. . |
| 4,479,070 | 10/1984 | Frische et al. . |
| 4,633,122 | 12/1986 | Radice . |
| 4,639,631 | 1/1987 | Chason et al. . |
| 4,665,374 | 5/1987 | Fathimulla . |
| 4,698,820 | 10/1987 | Brandle, Jr. et al. . |
| 4,967,466 | 11/1990 | Takeya et al. . |
| 4,983,251 | 1/1991 | Haisma et al. . |
| 5,075,641 | 12/1991 | Weber et al. . |
| 5,166,646 | 11/1992 | Avanic et al. . |
| 5,302,879 | 4/1994 | Totty et al. . |
| 5,304,887 | 4/1994 | Heinecke et al. . |
| 5,319,324 | 6/1994 | Satoh et al. . |
| 5,483,115 | 1/1996 | Haisma et al. . |

FOREIGN PATENT DOCUMENTS

| | | |
|---|---|---|
| 0 503 892 | 9/1992 | European Pat. Off. . |
| 0531985 | 3/1993 | European Pat. Off. . |
| 0 575 948 | 12/1993 | European Pat. Off. . |
| 2547458 | 12/1984 | France . |
| 2701200 | 7/1977 | Germany . |
| 3922671 | 1/1991 | Germany . |
| 44 04 931 | 8/1994 | Germany . |
| 54-51792 | 4/1979 | Japan . |
| 55-64414 | 5/1980 | Japan . |
| 56-131219 | 10/1981 | Japan . |
| 59-67710 | 4/1984 | Japan . |
| 62-27040 | 6/1987 | Japan . |

(List continued on next page.)

OTHER PUBLICATIONS

Murakami, M., et al., Development of Compact Surface Mounting Tape Quartz Crystal Resonator Measuring 7.0× 5.0×2.3 mm$^3$, Nikkei Electronics, No. 517, pp. 163–169, (Jul. 1, 1991).

Kittel, C., "3 Crystal Binding", Introduction to Solid State Physics, Fifth Edition, (1976). pp. 92–97.

(List continued on next page.)

*Primary Examiner*—Carl E. Hall
*Attorney, Agent, or Firm*—Ratner & Prestia

[57] ABSTRACT

An electronic component includes a first substrate and a second substrate. A first conductive layer constituting a terminal electrode is formed on a first surface of the first substrate. A first insulating layer is formed on the first conductive layer. The first insulating layer and the second substrate are directly bonded to each other by at least one bond selected from the group consisting of a hydrogen bond and a covalent bond.

6 Claims, 9 Drawing Sheets

FOREIGN PATENT DOCUMENTS

| | | |
|---|---|---|
| 63-285195 | 11/1988 | Japan . |
| 1-211217 | 8/1989 | Japan . |
| 2-232606 | 9/1990 | Japan . |
| 3-178206 | 8/1991 | Japan . |
| 4-283957 | 10/1992 | Japan . |
| 4-313211 | 11/1992 | Japan . |
| 705642 | 12/1979 | U.S.S.R. . |
| 2202989 | 10/1988 | United Kingdom . |

OTHER PUBLICATIONS

Castera, J. P., "State of the Art in Design and Technology of MSW Devices (Invited)", Journal of Applied Physics, 55 (6), pp. 2506–2511 (1984).

Matsumoto, K. et al., "Preparation of Bi–Substituted YIG Garnets by Sol–Gel Synthesis and Their Properties", IEEE Translation Journal on Magnetics in Japan, vol. 6, No. 1, pp. 15–22 (Jan. 1991).

Totoki, M. et al., "Demonstration of Direct Bonding Between InP and Gadolinium Gallium Garnet ($Gd_3Ga_5O_{12}$) Substrates", Electronics Letters, vol. 30, No. 19, pp. 1534–1536 (Sep. 1994).

Haisma, J., et al., "Silicon–on–Insulator Wafer Bonding–Wafer Thinning Technological Evaluation", Japanese Journal of Applied Physics, vol. 28, No. 8, pp. 1426–1443 (Aug. 1989).

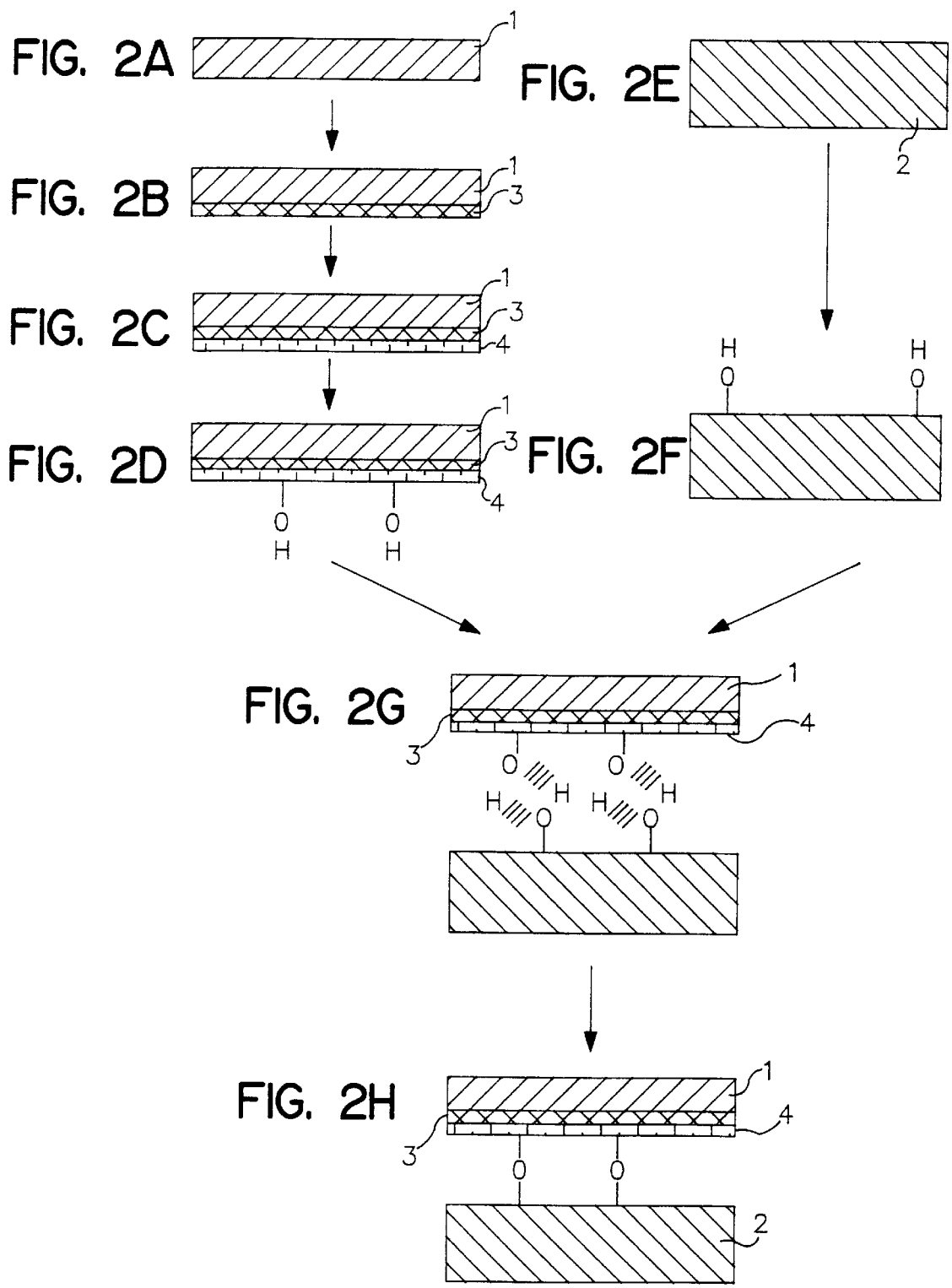

METHOD FOR PRODUCING AN ELECTRONIC COMPONENT USING DIRECT BONDING

This application is a division of application Ser. No. 08/333,210, filed Nov. 1, 1994, (status: pending).

BACKGROUND OF THE INVENTION

1. Field of the Invention:

The present invention relates to an electronic component, particularly to a piezoelectric device having a terminal electrode between a functional substrate and a holding substrate, and a method for producing the same.

2. Description of the Related Art:

Various kinds of piezoelectric devices utilizing piezoelectric effects, such as quartz oscillators and SAW filters, have widely been used as various high-frequency filters and oscillators in radio communication equipment. These piezoelectric devices use mechanical vibration of a piezoelectric element which is generated when an electric field is applied. Thus, the performance of such piezoelectric devices greatly depends upon a method for securing the piezoelectric element without affecting the mechanical vibration. In particular, the development of methods for securing a piezoelectric element without adversely affecting piezoelectric characteristics, hermetically sealing the piezoelectric element in the piezoelectric device, and providing electrodes leading out of the piezoelectric element have been important subjects.

The following methods have been known for conventional piezoelectric devices.

One method is to mechanically secure a piezoelectric element with springs, screws, etc. This method is easy to perform but it is difficult to obtain a piezoelectric device stable against thermal change, mechanical shock, etc. for a long period of time. Another method is to secure a piezoelectric element with various adhesives and conductive pastes made of an epoxy resin, a silicone resin, etc. This method also has problems. That is, since these adhesives have low heat resistance, when solder reflow treatment at a temperature around 230° C. is performed in the course of the production of a piezoelectric device, the oscillation frequency of the piezoelectric element is changed. In addition, the piezoelectric device thus produced has poor long-term thermal stability under use.

Moreover, it has been known to bond the piezoelectric element to a substrate, using glass having a low melting point. Even when glass having a low melting point is used, heat treatment at a temperature of about 500° C. or higher is required for obtaining a piezoelectric device with high reliability; therefore, the coefficient of thermal expansion of a substrate to which the piezoelectric element is to be bonded is required to match with that of a piezoelectric substrate of the piezoelectric device. Furthermore, materials for the piezoelectric device should be thermally stable at such a high temperature (i.e., about 500° C. or higher). As one method for solving these problems, Japanese Laid-Open Patent Publication No. 4-283957 discloses a method for bonding quartz crystal (piezoelectric single crystal) to silicon through direct bonding. The piezoelectric device in which the piezoelectric element is bonded to the substrate through direct bonding is remarkably stable against thermal change and mechanical vibration. According to the method disclosed in Japanese Laid-Open Patent Publication No. 4-283957, the respective surfaces of crystal and silicon to be bonded to each other are washed, the respective bonding surfaces of quartz crystal and silicon are subjected to hydrophilic treatment and bonded to each other, followed by heat treatment. The piezoelectric device produced by this method is mechanically and thermally stable; however, it is impossible to extend the terminal electrodes from the bonded portion between the piezoelectric element and the substrate, so that there are various restrictions such as the necessity of forming via holes for connecting the piezoelectric element to the other elements (see FIG. 1 of Japanese Laid-Open Patent Publication No. 4-283957).

SUMMARY OF THE INVENTION

The electronic component of this invention, includes a first substrate, a second substrate, a first conductive layer constituting a terminal electrode on a first surface of the first substrate, and a first insulating layer formed on the first conductive layer, wherein the first insulating layer and the second substrate are directly bonded to each other by at least one bond selected from the group consisting of a hydrogen bond and a covalent bond.

In one embodiment of the present invention, a thickness of an interface at which the first insulating layer and the second substrate are directly bonded to each other is 20 nm or less.

In another embodiment of the present invention, the first conductive layer is buried with the first insulating layer.

In still another embodiment of the present invention, the second substrate has convex portions at its periphery, and the first insulating layer and at least a part of the convex portions of the second substrate are directly bonded to each other.

In still another embodiment of the present invention, the first substrate is a piezoelectric substrate.

In still another embodiment of the present invention, the first substrate is a single crystalline piezoelectric substrate made of a material selected from the group consisting of quartz crystal, lithium niobate, lithium tantalate, and lithium borate.

In still another embodiment of the present invention, the second substrate is a single crystalline piezoelectric substrate made of a material selected from the group consisting of quartz crystal, lithium niobate, lithium tantalate, and lithium borate.

In still another embodiment of the present invention, the second substrate is a single crystalline silicon substrate.

In still another embodiment of the present invention, the second substrate is a glass substrate.

Alternatively, an electronic component of the present invention includes a functional portion and a package portion for hermetically sealing the functional portion, the functional portion including a substrate, a conductive layer constituting a terminal electrode formed on a first surface of the substrate, and an insulating layer formed on the conductive layer, wherein at least a part of the package portion and the insulating layer are directly bonded to each other by at least one bond selected from the group consisting of a hydrogen bond and a covalent bond.

In one embodiment of the present invention, the substrate of the functional portion is a piezoelectric substrate, and the functional portion functions as a piezoelectric element.

According to another aspect of the present invention, a method for producing an electronic component including a first substrate, a second substrate, and a conductive layer constituting a terminal electrode between the first substrate and the second substrate, the method includes the steps of:

forming the conductive layer constituting the terminal electrode on a first surface of the first substrate;

forming an insulating layer on the conductive layer;

conducting hydrophilic treatment on a surface of the insulating layer and a surface of the second substrate; and attaching the insulating layer to the second substrate with the respective surfaces subjected to the hydrophilic treatment faced each other, wherein the first substrate and the second substrate are directly bonded to each other by at least one bond selected from the group consisting of a hydrogen bond and a covalent bond.

In one embodiment of the present invention, the above-mentioned method includes the step of conducting heat treatment after attaching the insulating layer to the second substrate.

In another embodiment of the present invention, the step of forming the conductive layer is performed by one process selected from the group consisting of vacuum deposition, sputtering, and chemical vapor deposition.

In still another embodiment of the present invention, the step of forming the insulating layer is performed by one process selected from the group consisting of vacuum deposition, sputtering, and chemical vapor deposition.

In still another embodiment of the present invention, the surface of the insulating layer is flattened after forming the insulating layer.

In still another embodiment of the present invention, the step of forming the insulating layer is a step of coating a solution-state precursor of an insulator onto the conductive layer and heat-treating the precursor.

In still another embodiment of the present invention, the step of heat treatment includes a step of applying an electric field between the conductive layer and the second substrate.

Thus, the invention described herein makes possible the advantages of (1) providing an electronic component, particularly a piezoelectric device excellent in thermal and mechanical stability and sufficient airtightness, in which electrodes can be extended out of the bonded portion between a piezoelectric element and a substrate, and (2) providing a method for producing the electronic component.

These and other advantages of the present invention will become apparent to those skilled in the art upon reading and understanding the following detailed description with reference to the accompanying figures.

BRIEF DESCRIPTION OF THE DRAWINGS

FIGS. 2(a) through 2(h) show a process for manufacturing the electronic component of Example 1 according to the present invention.

DESCRIPTION OF THE PREFERRED EMBODIMENTS

Hereinafter, the present invention will be described by way of illustrative examples with reference to the drawings.

EXAMPLE 1

Figure 1:
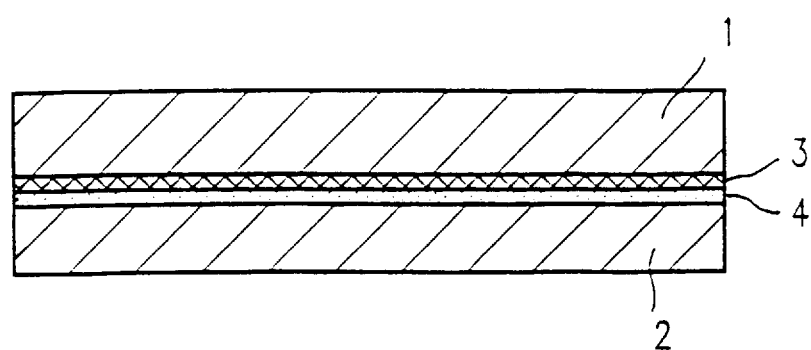
FIG. 1 is a cross-sectional view of an electronic component of Example 1 according to the present invention.

An electronic component of Example 1 according to the present invention will be described with reference to FIG. 1.

The electronic component includes a single crystalline piezoelectric substrate 1 (functional substrate), a holding substrate 2, a conductive layer 3, and an insulating layer 4. The single crystalline piezoelectric substrate 1 is directly bonded to the holding substrate 2 with the conductive layer 3 and the insulating layer 4 interposed therebetween through a hydrogen bond or a covalent bond at an interface between the insulating layer 4 and the holding substrate 2. In the present specification, the bond formed by the hydrogen bond or the covalent bond without using an adhesive is referred to as "direct bonding". It is noted that the direct bonding may include both the hydrogen bond and the covalent bond. Depending upon the materials for the substrates, an ion bond may be involved.

Suitable examples of the material for the single crystalline piezoelectric substrate 1 include quartz crystal, lithium niobate, lithium tantalate, and lithium borate.

As the material for the holding substrate 2, single crystalline piezoelectric materials selected from the group consisting of quartz crystal, lithium niobate, lithium tantalate, and lithium borate, a glass substrate (Example 2), and semiconductor materials such as silicon (Example 3) can be used.

Examples of the material for the conductive layer 3 include gold, aluminum, copper, nickel, and tungsten, that is, any material can be used as long as they can be formed into a film by thin film techniques such as vapor deposition, sputtering, and chemical vapor deposition (CVD).

Examples of the insulating layer 4 include oxides of silicon such as silicon oxide, nitrides of silicon such as silicon nitride, high-resistance silicon, and glass containing silicic acid.

Hereinafter, a method for producing an electronic component will be described.

The single crystalline piezoelectric substrate 1 made of a material selected from the group consisting of quartz crystal, lithium niobate, lithium tantalate, and lithium borate is flattened by grinding and further ground until the surface of the single crystalline piezoelectric substrate 1 becomes a mirror surface. Then, the surface of the single crystalline piezoelectric substrate 1 to be bonded is washed with a detergent or various kinds of solvents (FIG. 2(a)). The surface of the holding substrate 2 to be bonded is also ground in the same manner as in the single crystalline piezoelectric substrate 1 until the surface becomes a mirror surface and is washed (FIG. 2(e)). Then, the conductive layer 3 is formed by vapor deposition, sputtering, CVD, or the like at least on the surface of the single crystalline piezoelectric substrate 1 to be bonded (FIG. 2(b)). The thickness of the conductive layer 3 can be freely set in the range of about 0.1 $\mu$m to about 5 $\mu$m. Then, the insulating layer 4 is formed on the conductive layer 3 by vacuum deposition, sputtering, CVD, or the like (FIG. 2(c)). The thickness of the insulating layer 4 is in the range of about 1 $\mu$m to about 10 $\mu$m. The surface of the insulating layer 4 formed on the single crystalline piezoelectric substrate 1 and the surface of the holding substrate 2 to be bonded are made hydrophilic (FIGS. 2(d) and 2(f)). More specifically, the single crystalline piezoelectric substrate 1 with the insulating layer 4 and the holding substrate 2 are dipped in an ammonia-hydrogen peroxide solution as a hydrophilic treatment solution and are washed with pure water, whereby the surface of the insulating layer 4 and that of the holding substrate 2 are made hydrophilic.

Thereafter, the surface of the holding substrate 2 to be bonded is attached to the surface of the insulating layer 4 and heated, whereby both of the substrates 1 and 2 are bonded to each other at an interface between the insulating layer 4 and the holding substrate 2 by vander Waals force (hydrogen bond) of hydroxyl groups which are components of water adsorbed to the interface (FIG. 2(g)). The bonding strength is increased by heating the bonded interface (FIG. 2(h)). In the case where the heating temperature is low, direct bonding of a hydrogen bond between hydroxyl groups adsorbed to the respective surfaces plays an important role. When the bonded interface is heat-treated at a temperature of 100° C. to 1000° C. for several minutes to tens of minutes, hydrogen is released from the interface and a bond including an oxygen atom is formed. As a result of the measurement of a lattice distortion of the bonded substrates 1 and 2 by a high-temperature X-ray diffraction method, it can be presumed that a temperature at which the bond including an oxygen atom starts being formed is between 200° C. and 300° C. Thus, it can be presumed that in the case where the bonded interface is heat-treated at a temperature equal to or lower than this temperature range, the hydrogen bond mainly contributes to the direct bonding, and in the case where the bonded interface is heat-treated at a temperature sufficiently higher than this temperature range, the bond including an oxygen atom mainly contributes to the direct bonding.

Even in the case where the direct bonding is formed at room temperature, since considerable bonding strength is obtained, the electronic component produced is satisfactory depending upon its use. When electronic components are produced through a solder reflow step, the direct bonding is desirably conducted at a temperature equal to or higher than the solder reflow temperature (approximately 230° C.). The bonding strength can be increased by applying pressure to the interface to be bonded in the course of the formation of the direct bonding.

The principle of the direct bonding will be described with reference to FIGS. 3(a) through 3(c).

Figure 3A:
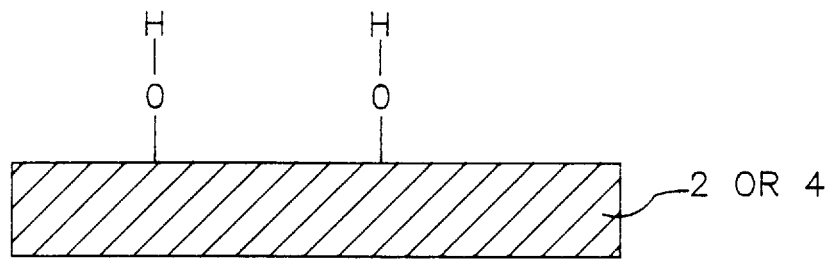
FIGS. 3(a) through 3(c) schematically show a principle of direct bonding according to the present invention.
Figure 3B:
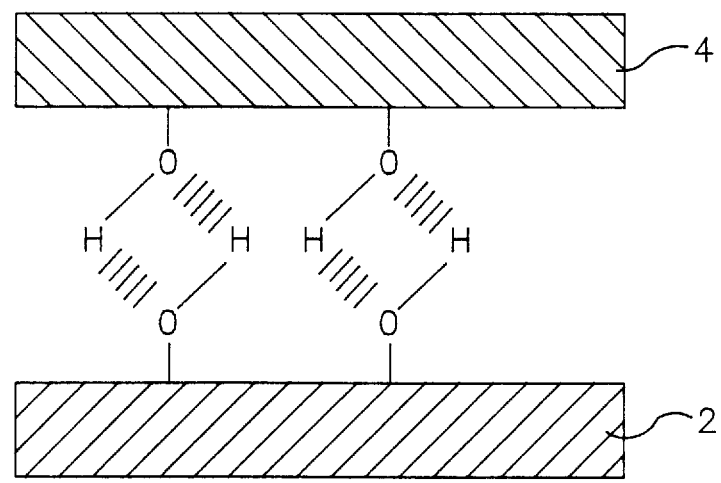
Figure 3C:
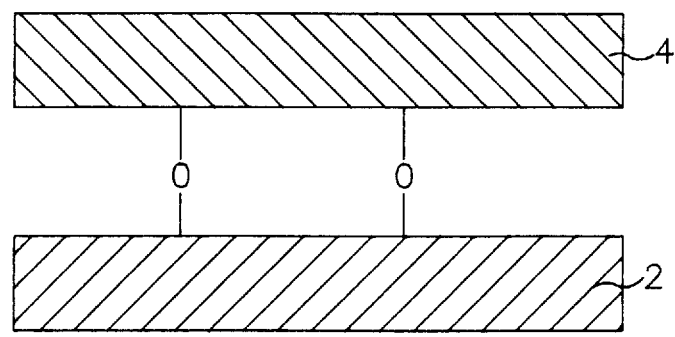

The surface of the holding substrate 2 or that of the insulating layer 4 formed on the single crystalline piezoelectric substrate 1 is subjected to hydrophilic treatment to form hydroxyl groups on the respective surfaces (FIG. 3(a)). When both of the surfaces which are made hydrophilic are attached to each other, a hydrogen bond is formed between hydroxyl groups on the respective surfaces (FIG. 3(b)). Because of this hydrogen bond, the holding substrate 2 is directly bonded to the single crystalline piezoelectric substrate 1. Furthermore, when the bonded interface is heat-treated, water or hydrogen is released from the hydrogen bond to form a covalent bond through oxygen (FIG. 3(c)).

With respect to various combinations of the single crystalline piezoelectric substrate and the holding substrate, directly bonded interfaces without being subjected to heat treatment were observed by using a transmission electron microscope (TEM). The thickness of a directly bonded interface layer (bonded layer) was about 10 nm (i.e., several molecular layers) or less in any combination; bonded layers having a thickness exceeding 20 nm were not observed. On the other hand, when the single crystalline piezoelectric substrate and the holding substrate were bonded to each other with a generally used organic adhesive, the thickness of the bonded layer is generally in the range of about 1 $\mu$m to about 5 $\mu$m. In the case of using an inorganic adhesive such as glass having a low melting point, the bonded layer has almost the same thickness as that in the case of using the organic adhesive. Even though either kind of adhesive (i.e., an organic adhesive or an inorganic adhesive) is used, the thickness of the bonded layer cannot be controlled to 20 nm or less, and hence a precision bond such as the direct bonding according to the present invention cannot be obtained.

As described above, according to the method of the present invention, the single crystalline piezoelectric layer and the holding substrate are bonded to each other through a layer as thin as 20 nm or less, so that the airtightness at the directly bonded interface becomes remarkably good.

In the present example, as a material for the insulating layer 4, silicon, silicon oxide, silicon nitride, glass containing silicic acid, or the like is used. In either case, the release of hydrogen increases a covalent bond between oxygen and silicon to enhance the bond at the interface.

As described above, when the single crystalline piezoelectric substrate 1 and the insulating layer 4 are bonded to each other by the method of the present example, by using a material selected from the group consisting of quartz crystal, lithium niobate, lithium tantalate, and lithium borate for the single crystalline piezoelectric substrate 1; using a single crystalline piezoelectric substrate made of a material selected from the group consisting of quartz crystal, lithium niobate, lithium tantalate, and lithium borate, a silicon semiconductor substrate, or a glass substrate as the holding substrate 2; and using oxides of silicon such as silicon oxide, nitrides of silicon such as silicon nitride, high-resistance silicon, or glass containing silicon for the insulating layer 4, a hydrogen bond through a hydroxyl group or a covalent bond through oxygen is obtained as the direct bonding. This direct bonding is obtained without using other materials such as an adhesive at the bonded interface, so that it is thermally and mechanically stable and has high airtightness.

In particular, when a material having a covalent bond of silicon and oxygen, such as quartz crystal and silicon is used for the holding substrate 2, the transformation from a hydrogen bond to a covalent bond at the directly bonded interface is smoothly conducted. In the case where lithium niobate, lithium tantalate, or lithium borate is used for the holding substrate 2, since oxygen is rich in the constituting element of these materials, the oxygen and silicon in the insulating layer 4 easily form a covalent bond to directly bond the holding substrate 2 to the insulating layer 4. In the case where glass is used for the holding substrate 2, since glass generally contains silicic acid and a covalent bond of silicon and oxygen, the transformation from a hydrogen bond to a covalent bond is smoothly conducted.

Satisfactory direct bonding can be obtained by the method of the present example in any of the above-mentioned combinations of the substrates. It is noted that the heat treatment is conducted at higher temperature within the temperature range in which the crystals maintain piezoelectricity and the holding substrate 2, the conductive layer 3, and the insulating layer 4 are not deteriorated, the bonding strength is increased.

The electronic component thus produced has remarkably stable characteristics with respect to thermal change and mechanical vibration, since the two substrates are bonded to each other at an atomic level. More specifically, when the heat treatment is conducted at 250° C. or higher, the change in initial characteristics is hardly seen after the soldering at 230° C.

Figure 4:
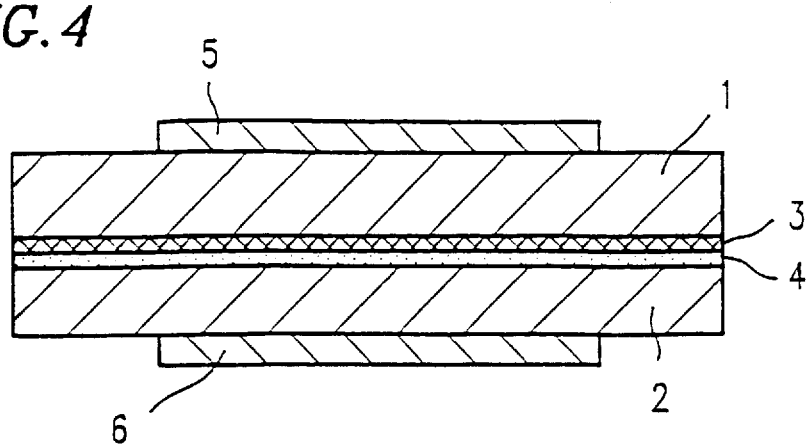
FIG. 4 is a cross-sectional view of a piezoelectric device of Example 1 according to t he present invention.

The above-mentioned construction can be applied to various kinds of electronic components. FIG. 4 shows a piezoelectric device according to the present invention. In this figure, identical components with those in FIG. 1 bear the identical reference numerals therewith. The single crystalline piezoelectric substrate 1 is directly bonded to the holding substrate 2 with the conductive layer 3 and the insulating layer 4 interposed therebetween. On the respective external sides of the single crystalline piezoelectric substrate 1 and the holding substrate 2, an upper electrode 5 and a lower electrode 6 are formed. In this piezoelectric device, as the holding substrate 2, a substrate similar to the single crystalline piezoelectric substrate 1 is used.

The piezoelectric device of FIG. 4 can be operated as a piezoelectric actuator, a so-called bimorph cell, by applying a voltage across the electrodes 5, 6 and the conductive layer 3 under the condition that the substrates 1 and 2 are polarized in an appropriate direction. In this case, the conductive layer 3 functions as an electrode applying an electric field to the substrates 1 and 2.

Figure 5:
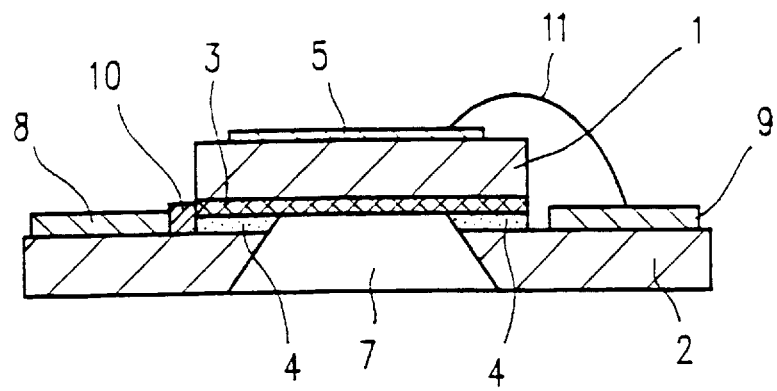
FIG. 5 is a cross-sectional view of another piezoelectric device of Example 1 according to the present invention.

FIG. 5 shows another example of a piezoelectric device. In this figure, the identical components with those in FIG. 1 bear the identical reference numerals therewith. The upper electrode 5 is provided so as to face the conductive layer 3 on the single crystalline piezoelectric substrate 1. A through-hole 7 is formed in a part of the holding substrate 2. On the upper face of the holding substrate 2, wirings 8 and 9 are provided. The wiring 8 is electrically connected to the conductive layer 3 through a conductive adhesive 10. The upper electrode 5 is electrically connected to the wiring 9 through a metal wire 11. In this construction, the single crystalline piezoelectric substrate 1 works as a piezoelectric oscillator, and the holding substrate 2 holds the single crystalline piezoelectric substrate 1. A portion of the conductive layer 3 facing the through-hole 7 and the upper electrode 5 work as piezoelectric oscillation excitation electrodes. A bonding interface portion of the conductive layer 3 works as a terminal electrode for connecting to the wiring 8 on the upper face of the holding substrate 2.

When identical materials (e.g., quartz crystal) are used for the single crystalline piezoelectric substrate 1 and the holding substrate 2 in the above-mentioned construction, a piezoelectric device stable against change in temperature can be obtained because of the same coefficient of thermal expansion of the substrates 1 and 2. Since the conductive layer 3 working as a lower electrode for exciting the oscillation of the piezoelectric device and the wirings 8 and 9 provided on the upper face of the holding substrate 2 are positioned on the identical flat face, it is not required to provide a via hole in the holding substrate 2 to lead out a wiring therefrom. Thus, according to the construction of the present invention, wiring can be simplified. In addition, since all of the wiring portions are provided on the identical flat face, the vibrating portion can be hermetically sealed by sealing only the upper portion of the holding substrate 2. This is advantageous in terms of mounting. In this construction, the insulating layer 4 and the holding substrate 2 are directly bonded to each other through a hydrogen bond or a covalent bond, enabling a piezoelectric device which is excellent in long-term reliability and is remarkably stable against the thermal change and mechanical vibration. In the present example, a portion of the insulating layer 4 corresponding to the through-hole 7 is removed by etching; in the case where the thickness of the insulating layer 4 is small, the portion of the insulating layer 4 may be retained.

Since the conductive adhesive 10 and the metal wire 11 merely work for electrical conduction, many materials can be used.

EXAMPLE 2

An electronic component of Example 2 according to the present invention will be described with reference to FIG. 6.

Figure 6:
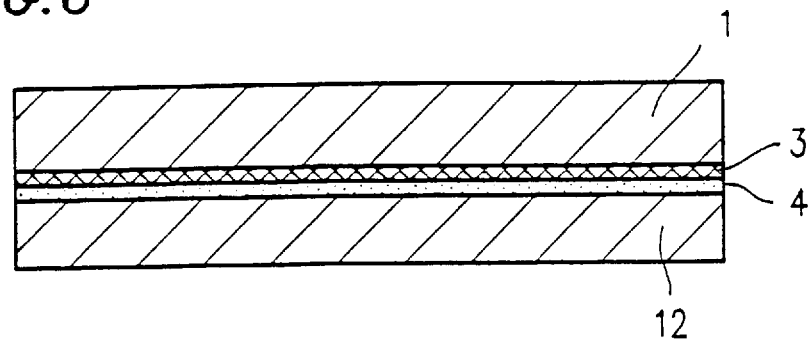
FIG. 6 is a cross-sectional view of an electronic component of Example 2 according to the present invention.
Figure 7:
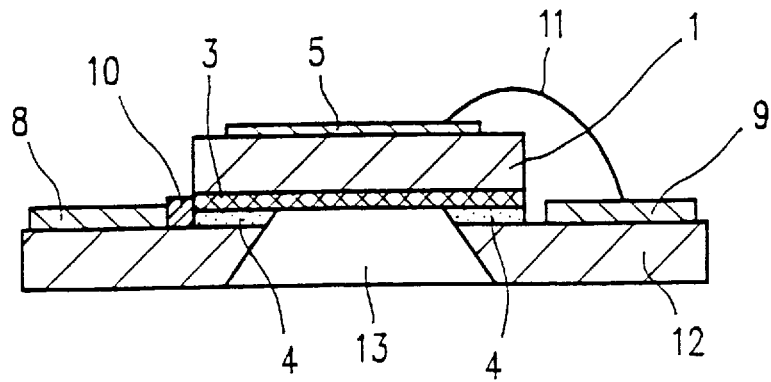
FIG. 7 is a cross-sectional view of a piezoelectric device of Example 2 according to the present invention.

In FIG. 6, a single crystalline piezoelectric substrate, i.e., a functional substrate made of a material selected from the group consisting of quartz crystal, lithium niobate, and lithium tantalate is denoted by the reference numeral 1 in the same way as in Example 1. In the present example, a glass substrate is used as a holding substrate 12. As a material for the glass substrate 12, bolosilicate glass, and glass containing silicon such as quartz glass can be used. The electronic component of the present example can be produced by the same method as that of Example 1. The construction of the present example can be applied to a thermally and mechanically stable piezoelectric device as shown in FIG. 7. In FIG. 7, a single crystalline piezoelectric substrate, i.e., a functional substrate is denoted by the reference numeral 1, a conductive layer is denoted by the reference numeral 3, an insulating layer is denoted by the reference numeral 4, and a holding substrate made of glass is denoted by the reference numeral 12. The reference numeral 13 denotes a through-hole provided in a part of the holding substrate 12, and the reference numeral 5 denotes an upper electrode provided on the upper face of the electronic component. The respective components denoted by the reference numerals 8, 9, 10, and 11 have the same functions as those denoted by the respective identical reference numerals in Example 1. A portion of the conductive layer 3 facing the through-hole 13 and the upper electrode 5 are used as piezoelectric oscillation excitation electrodes. A bonding interface portion of the conductive layer 3 works as a terminal electrode for connecting to the wiring on upper face of the holding substrate 12.

When the coefficient of thermal expansion of the single crystalline piezoelectric substrate 1 and the glass holding substrate 12 are set to be the same value in the above-mentioned construction, a piezoelectric device stable against a change in temperature can be obtained. In this case, since the conductive layer 3 working as the lower electrode for exciting the oscillation of the piezoelectric device, and the wirings 8 and 9 provided on the upper face of the glass holding substrate 12 holding the single crystalline piezoelectric substrate 1 are positioned on the identical flat face, it is not required to provide a via hole in the holding substrate 12 to lead out a wiring therefrom. Thus, according to the construction of the present invention, the wiring can be simplified. In addition, the oscillating portion can be hermetically sealed with ease in the same way as in Example 1. In this construction, the insulating layer 4 and the holding substrate 12 are directly bonded to each other through a hydrogen bond or a covalent bond, enabling a piezoelectric device which is excellent in long-term reliability and is remarkably stable against thermal change and mechanical vibration.

EXAMPLE 3

Figure 8:
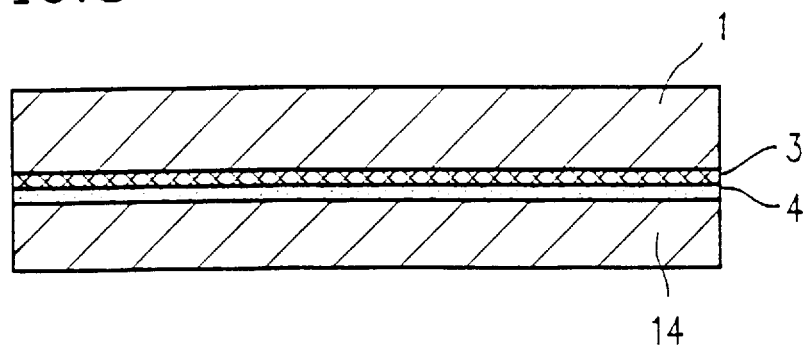
FIG. 8 is a cross-sectional view of an electronic component of Example 3 according to the present invention.
Figure 9:
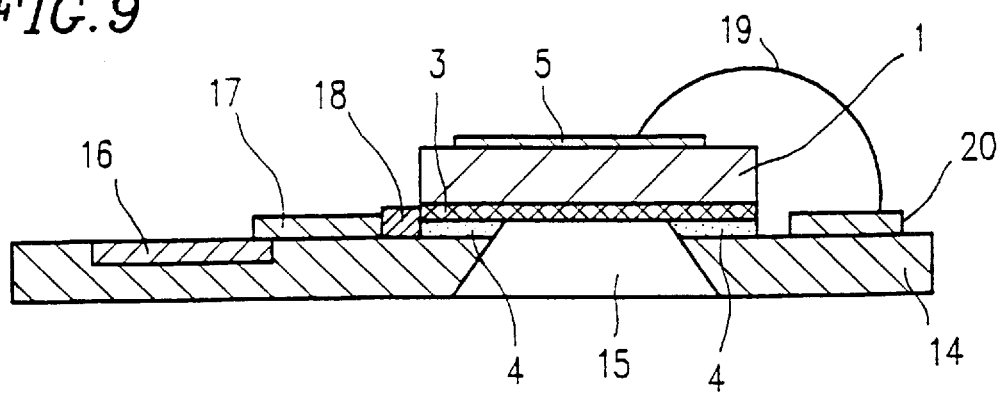
FIG. 9 is a cross-sectional view of a piezoelectric device of Example 3 according to the present invention.

An electronic component of Example 3 according to the present invention will be described with reference to FIG. 8. In FIG. 8, a single crystalline piezoelectric substrate made of a material selected from the group consisting of quartz crystal, lithium niobate, and lithium tantalate is denoted by the reference numeral 1 in the same way as in Example 1. The reference numerals 3 and 4 denote a conductive layer and an insulating layer, respectively, and the respective components denoted by the reference numerals 5, 8, 9, 10, and 11 have the same functions as those denoted by the respective identical reference numerals in Example 1. In the present example, as a holding substrate 14, a semiconductor substrate made of silicon is used. The electronic component of the present example can be produced in the same way as in Example 1. The construction of the present example can be applied to, for example, a piezoelectric device which is excellent in holding structure, is thermally and mechanically stable, and can be integrated with a semiconductor circuit. In FIG. 9, the reference numerals 1, 3, 4, 14, and 15 respectively denote a single crystalline piezoelectric substrate, a conductive layer, an insulating layer, a semiconductor holding substrate, and a through-hole provided in a part of the semiconductor holding substrate 14. An upper electrode 5 is provided on the upper face of the single crystalline piezoelectric substrate 1. On the semiconductor substrate 14, an electronic element such as a transistor or an integrated circuit constituted by transistors 16 is provided. A wiring 17 electrically connects the electronic element or integrated circuit 16 provided on the semiconductor substrate 14 to the conductive layer 3 working as a lower electrode of the piezoelectric device, for example, with a conductive adhesive 18. The upper electrode 5 is connected to a wiring 20 on the semiconductor substrate 14, for example, through a wire 19. A portion of the conductive layer 3 facing the through-hole 15 and the upper electrode 5 are used as piezoelectric oscillation excitation electrodes. A bonding interface portion of the conductive layer 3 work as a terminal electrode for connecting to the wiring on the upper face of the semiconductor substrate 14.

In the present example, since the conductive layer 3 which is a lower electrode for exciting the oscillation of the piezoelectric device and the wiring 17 provided on the upper face of the semiconductor substrate 14 for holding the single crystalline piezoelectric substrate 1 are formed on the identical face, it is not required to form a via hole in the semiconductor substrate 14 to lead out a wiring therefrom. This is advantageous in terms of wiring. In addition, since all of the wirings and components including the piezoelectric device are provided on the upper portion of the semiconductor substrate 14, they can be hermetically sealed only on the upper face of the semiconductor substrate 14. Furthermore, the semiconductor substrate 14 is directly bonded to the single crystalline piezoelectric substrate 1 through the insulating layer 4, so that a piezoelectric device which is remarkably stable against thermal change and mechanical vibration and is excellent in long-term reliability can be obtained.

EXAMPLE 4

In the present example, a DC voltage is applied to the interface between the conductive layer 3 and the holding substrate 2 when they are subjected to heat treatment in the methods of Examples 1 to 3. More specifically, the conductive layer 3 and the insulating layer 4 are formed on the single crystalline piezoelectric substrate 1 made of a material selected from the group consisting of quartz crystal, lithium niobate, lithium tantalate, and lithium borate; and the surface of the insulating layer 4 and that of the holding substrate 2 are subjected to hydrophilic treatment in the same way as in Example 1. Then, a DC voltage is applied to the interface between the conductive layer 3 and the holding substrate 2 when they are subjected to heat treatment. By applying a DC voltage to the interface while heating, movable ions start moving at the interface and the bond is easily formed by the electrostatic force of these ions, whereby a satisfactory bond can be obtained at low temperatures for a short period of time. More specifically, by applying a DC voltage of 500 to 1,000 volts, the time required for forming a bond can be shortened by 30 to 50% compared with Example 1.

The hydrophilic treatment on the surface of the bonded portion can be omitted. In the case where the hydrophilic treatment is omitted, direct bonding can be formed by applying a higher voltage at a higher temperature. However, in the case where the substrates having a great difference in coefficient of thermal expansion are bonded to each other, or in the case where the substrates whose characteristics are changed upon heat treatment at high temperatures are bonded to each other, it is preferred that both of the substrates are bonded to each other after the hydrophilic treatment.

EXAMPLE 5

Figure 10:
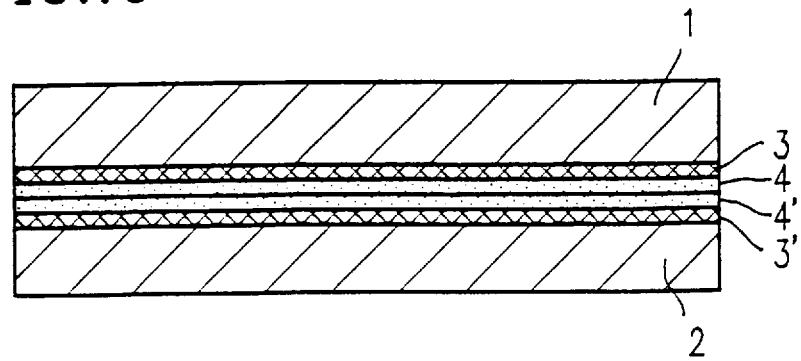
FIG. 10 is a cross-sectional view of an electronic component of Example 5 according to the present invention.

Example 5 will be described with reference to FIG. 10.

In the present example, the process is performed in the same way as in Example 1 until the step of forming conductive layer 3 and the insulating layer 4 on the single crystalline piezoelectric substrate 1 which is a functional substrate made of a material selected from the group consisting of quartz crystal, lithium niobate, lithium tantalate, and lithium borate. In the present example, a second conductive layer 3' and a second insulating layer 4' are further formed on the holding substrate 2. The respective surfaces to be bonded of the insulating layer 4 and the second insulating layer 4' are subjected to hydrophilic treatment and washed with pure water in the same manner as in the method of Example 1.

In the present example, a DC voltage is applied as follows: When the heat treatment is conducted under the condition that the substrates 1 and 2 are attached to each other, a DC voltage is applied across the conductive layer 3 provided on the single crystalline piezoelectric substrate 1 and a second conductive layer 3' provided on the holding substrate 2, whereby a DC voltage is applied to the bonded interface. By applying a DC voltage to the interface while heating, movable ions start moving at the interface, and the single crystalline piezoelectric substrate 1 and the holding substrate 2 are easily bonded to each other by the electrostatic force of these ions. In this case, since an electric field with higher intensity compared with Example 4 can be applied to the bonded interface, a satisfactory bond can be easily obtained with DC voltage lower than that of Example 4 by at least one order of magnitude. FIG. 10 shows a construction of an electronic component obtained in the present example. In FIG. 10, the components denoted by the reference numerals 1, 2, 3, and 4 have the same functions as those denoted by the respective identical reference numerals in Example 1. A piezoelectric device having almost the same function as that described in Example 1 can be obtained without using the second conductive layer 3' or electrically connecting the second conductive layer 3' to the conductive layer 3.

EXAMPLE 6

An electronic component of Example 6 according to the present invention will be described with reference to FIGS. 11(a) through 11(c).

Figure 11A:
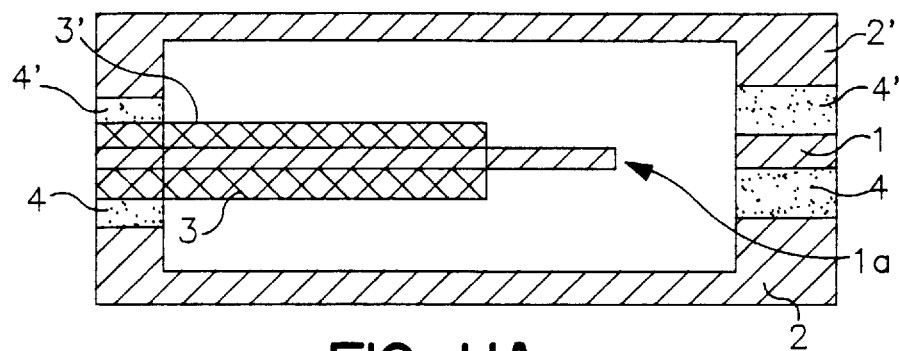
FIG. 11(a) is a cross-sectional view of a piezoelectric device of Example 6 according to the present invention.

FIG. 11(a) is a cross-sectional view of a piezoelectric device of the present example. FIG. 11(b) shows a single crystalline piezoelectric substrate and conductive layers provided on the top and bottom faces thereof, seen from the top side. FIG. 11(c) is a left-side cross-sectional view of the piezoelectric device. In FIGS. 11(a) through 11(c), a single crystalline piezoelectric substrate which is a functional substrate made of a material selected from the group consisting of quartz crystal, lithium niobate, and lithium tantalate is denoted by the reference numeral 1. The single crystalline piezoelectric substrate 1 and the conductive layers 3 and 3' formed on a top face and a bottom face of the single crystalline piezoelectric substrate 1 constitute a functional portion of the piezoelectric device. In the present example, the holding substrates 2 and 2' have a concave portion at the respective centers thereof and a convex portion at the respective peripheries thereof and constitute a package portion for hermetically sealing the functional portion. As the holding substrates 2 and 2', a single crystalline piezoelectric substrate made of a material selected from the group consisting of quartz crystal, lithium niobate, lithium tantalate, and lithium borate, a semiconductor substrate made of silicon, and a glass substrate can be used in the same way as in Examples 1 to 3.

Figure 11B:
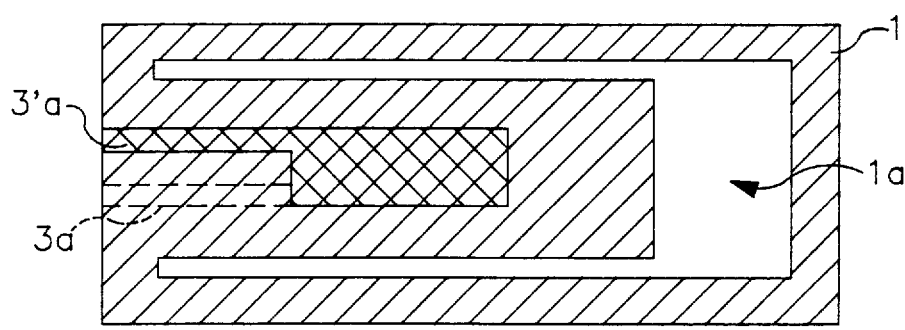
FIG. 11(b) shows a single crystalline piezoelectric substrate and conductive layers provided on the top and bottom faces thereof, seen from the top side.

The single crystalline piezoelectric substrate 1 of the present example has a projected portion 1a inside thereof as shown in FIG. 11(b). The projected portion 1a is formed by providing an opening in the single crystalline piezoelectric substrate 1. On both surfaces of the projected portion 1a, the conductive layers 3 and 3' are provided so that the respective center portions face each other, and function as an oscillating portion. The portions of the single crystalline piezoelectric substrate 1 other than the projected portion 1a are directly bonded to the peripheral convex portions of the holding substrates 2 and 2' through insulating layers 4 and 4'. As a result, the projected portion 1a is hermetically sealed in the concave portions of the holding substrate 2 and 2'. The upper electrode 31 and the lower electrode 3 formed on both surfaces of the projected portion 1a have extending portions 3a and 3'a toward the end of the projected portion 1a. The extending portions 3a and 3'a are positioned so as not to face each other. The ends of the extending portions 3a and 3'a are covered with the insulating layers 4 and 4' and are directly bonded to the supporting substrates 2 and 2' through the insulating layers 4 and 4'. Since the extending portions 3a and 3'a of the upper and lower electrodes 3 and 3' expose the end faces thereof at the end of the single crystalline piezoelectric substrate 1 (FIG. 11(c)), the extending portions 3a and 3'a function as terminal electrodes of the piezoelectric device. Furthermore, in the piezoelectric device of the present example, the projected portion 1a of the single crystalline piezoelectric substrate 1 is separated from the peripheries of the holding substrates 2 and 2' by the opening, so that excellent oscillation characteristics can be obtained. Furthermore, since the extending portions 3a and 3'a of the upper and lower electrodes 3 and 3' are disposed so as not to face each other with respect to the single crystalline piezoelectric substrate 1, the excitation of the oscillation of the piezoelectric device by the extending portions 3a and 3'a is suppressed.

In the present example, the conductive layers 3 and 3' which are electrodes for exciting the oscillation of the piezoelectric device are two-dimensionally buried with the insulating layers 4 and 4' and two-dimensionally led out from a hollow portion of the holding substrates 2 and 2'. Therefore, the hermetic sealing by direct bonding can be easily conducted.

Furthermore, a piezoelectric device which is stable against the thermal change and mechanical vibrations in the same way as in the other examples and which is excellent in long-term reliability can be obtained.

In the present example, the construction in which the convex portions are provided at the peripheries of the holding substrates 2 and 2' and the convex portions are directly bonded to the functional substrate 1 is shown. The present invention is not limited to the above-mentioned construction. Alternatively, concave portions are provided at the centers on both sides of the functional substrate 1, electrodes for exciting the oscillation are formed in the concave portions, and terminal electrodes electrically connected to the electrodes for exciting the oscillation are formed on the peripheral convex portions. In this construction, the flat holding substrate is directly bonded to the functional substrate through the insulating layer.

In the present example, one end of the vibrating portion of the functional substrate is secured. Alternatively, in the case where the confinement of piezoelectric oscillation energy can be conducted by the electrode construction, both ends of the oscillating portion can be secured, or the entire periphery of the oscillating portion can be secured. In this case (i.e., in the case where the entire periphery of the vibrating portion is secured), terminal electrodes are not required to be formed at the identical end of the convex portion of the holding substrates 2 and 2'. Instead of that, the terminal electrodes can be provided at facing ends or can be extended from any end.

Figure 11C:
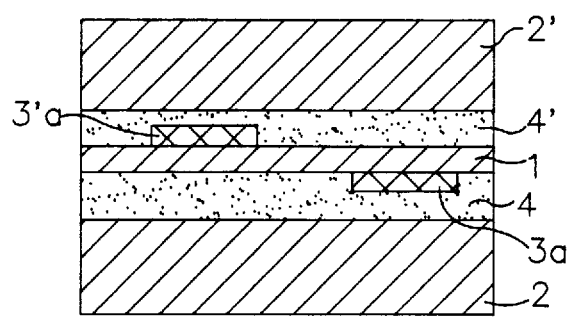
FIG. 11(c) is a left-side cross-sectional view of the piezoelectric device.
Figure 12A:
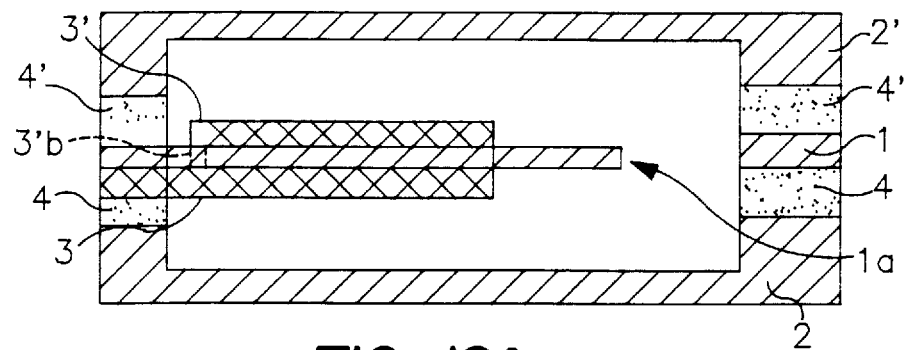
FIG. 12(a) is a cross-sectional view of another piezoelectric device of Example 6 according to the present invention.
Figure 12B:
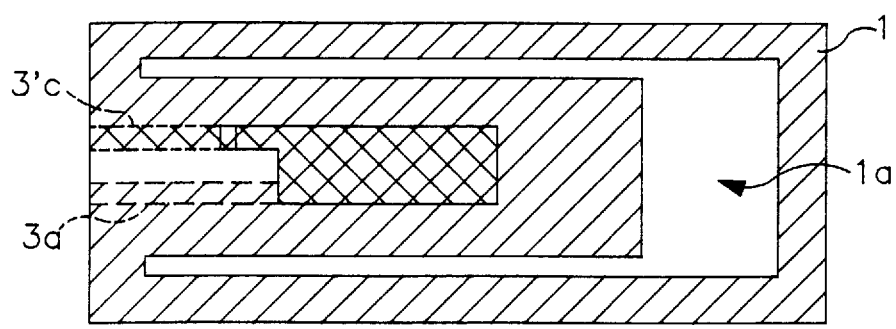
FIG. 12(b) shows a single crystalline piezoelectric substrate and conductive layers provided on the top and bottom faces thereof, seen from the top side.
Figure 12C:
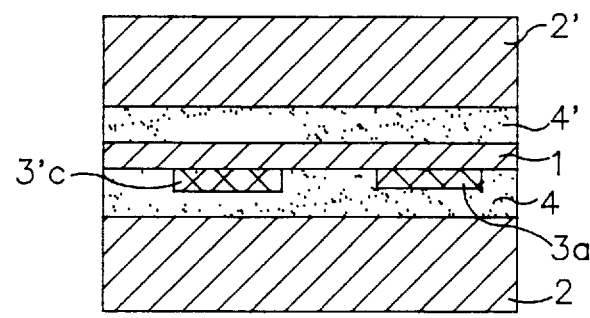
FIG. 12(c) is a left-side cross-sectional view of the piezoelectric device.

FIG. 12(a) is a cross-sectional view of another piezoelectric device of Example 6 according to the present invention. FIG. 12(b) shows a single crystalline piezoelectric substrate and conductive layers provided on the top and bottom faces thereof, seen from the top side. FIG. 12(c) is a left-side cross-sectional view of the piezoelectric device. The components identical with those in FIGS. 11(a) through 11(c) are denoted by the identical reference numerals therewith.

In the piezoelectric device shown in FIG. 11(a) through 11(c), the electrodes for exciting the oscillation and the terminal electrodes are formed on the top and bottom faces of the functional substrate 1. As shown in FIGS. 12(a) through 12(c), a via hole 3'b is provided in the functional substrate 1 and the electrode for exciting the oscillation 3' is led out to be connected to a terminal electrode 3'c formed on the identical surface as that of the electrode 3 through the via hole 3'b, whereby terminal electrodes can be led out from the identical face as shown in FIG. 12(c). In the present example, the upper and lower surfaces of the via hole 3'b are present in the hermetically sealed portion; therefore, it is not required to hermetically seal the via hole portion, making it possible to obtain highly reliable airtightness even with a via hole.

Figure 13A:
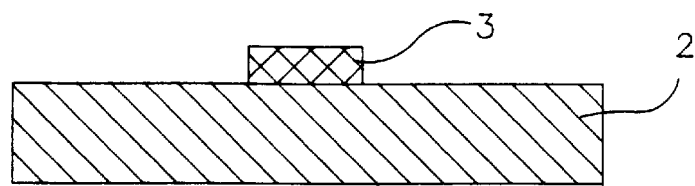
FIGS. 13(a) through 13(c) are views showing a method for producing an insulating layer of Example 6 according to the present invention.
Figure 13B:
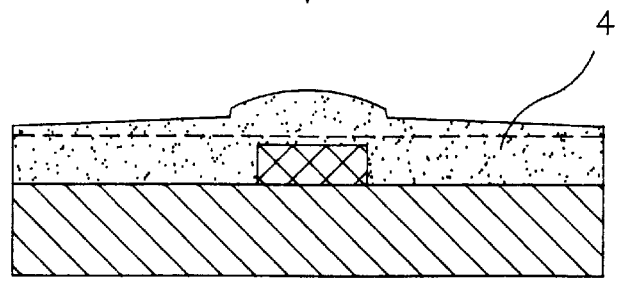
Figure 13C:
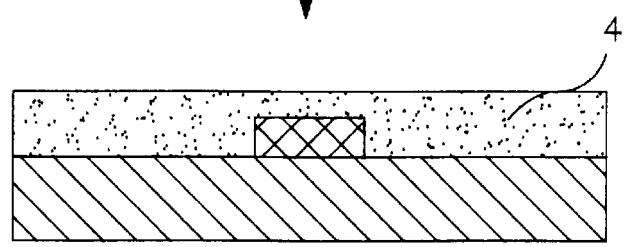

A method for producing a piezoelectric device having the construction of the present example is substantially the same as that described in Example 1. In the present example, after the conductive layers 3 and 3' are covered with the insulating layers 4 and 4', the insulating layers 4 and 4' are flattened. More specifically, after the conductive layers 3 and 3' are formed, inorganic thin films having a thickness equal to or larger than that of the conductive layers 3 and 3' are formed on the conductive layers 3 and 3' by vacuum deposition, sputtering, or chemical vapor deposition, and the insulating layer portion mounted on the upper portion of the conductive layers 3 and 3' is removed by grinding or the like to flatten the surface of the insulating layers 4 and 4'. FIGS. 13(a) through 13(c) show this process. By directly bonding the insulating layers 4 and 4' to the functional substrate 1, the hermetic sealing at the interface between the insulating layers 4 and 4' and the functional substrate 1 is completed. It is noted that a method described in Example 4 may be used for direct bonding.

EXAMPLE 7

Example 7 of the present invention will be described. In the present example, a solution is used for forming the insulating layer 4 in Examples 1 to 6. The insulating layer 4 is formed by coating a precursor in a solution state, followed by solidifying by heat treatment. The surface of the insulating layer 4 thus obtained and that of the bonding portion to which the insulating layer 4 is to be bonded are made hydrophilic and heat-treated under these surfaces are attached to each other, whereby direct bonding is formed in the same way as in the other examples.

Figure 14:
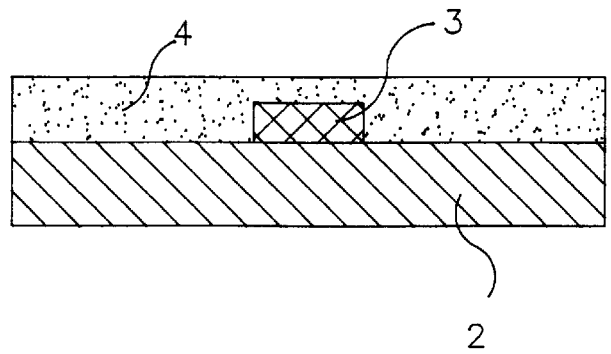
FIG. 14 is a view showing an insulating layer of Example 7 according to the present invention.

Even though a convex portion corresponding to the conductive layer 3 is formed, by coating the insulating layer 4 in a solution state (e.g., spin coating) so as to have thickness larger than that of the conductive layer 3, the upper portion of the conductive layer 3 (i.e., the convex portion) can be flattened as shown in FIG. 14. Thus, a method for producing a piezoelectric device can be simplified since the step of flattening the insulating layer 4 as described in Example 6 is not required.

An example of a material capable of being coated in a solution state to form an insulating layer by heat treatment includes alkyl silanol ($RSi(OH)_3$; R is an alkyl group). The dissolved alkyl silanol in a solvent such as alcohol is coated and dried. Then, the solvent and the alkyl group can be removed by heat treatment at 300 to 600° C. As a result, alkyl silanol is changed into a silicon oxide. The silicon oxide thus obtained includes three-dimensionally bonded $SiO_2$ is generally represented by $(-SiO-)n$, and has a satisfactory insulating property. In the construction of the present invention, the thickness of the insulating layer 4 is sufficiently small. Therefore, in the case where direct bonding is formed, the airtightness at the interface becomes satisfactory.

Moreover, hydroxyl groups are likely to remain on the surface of the insulating layer formed by the method of the present example. Therefore, direct bonding is easily formed.

Furthermore, since hydrogen released from hydroxyl groups is likely to be released from the bonded interface, voids are not generated on the bonded interface.

Other materials can also be used, as long as they can be coated in a solution state to form the insulating layer 4 by heat treatment.

In the above-mentioned examples, specific applications of the electronic component are shown; however, the present invention is not limited thereto.

According to the electronic component and the method for producing the same of the present invention, in the initial state, the surface of the insulating layer and the surface of the holding substrate are bonded to each other mainly by a hydrogen bond formed by a hydroxyl group adsorbed to the surface of the holding substrate. Hydrogen is released from the interface between the insulating layer and the holding substrate upon heat treatment, and a covalent bond through oxygen is increased to enhance the bonding strength at the interface. For this reason, stability against mechanical vibration can be obtained.

In the case where identical materials are used for the single crystalline piezoelectric substrate and the holding substrate, stability against a change in temperature is obtained since the coefficients of thermal expansion of both of the substrates are the same. Even in the case where glass having the same coefficient of thermal expansion as that of the single crystalline piezoelectric substrate is used for the holding substrate, the same effects are obtained. When the holding substrate is made of quartz crystal or silicon, the holding substrate is constituted by a covalent bond of silicon and oxygen; therefore, the transformation from the hydrogen bond to the covalent bond during heat treatment is smoothly conducted. In the case where the holding substrate is made of lithium niobate, lithium tantalate, and lithium borate, since oxygen is rich in the constituting elements of these compounds, the oxygen and silicon in the insulating layer easily forms a covalent bond. In the case where the holding substrate is made of glass, a covalent bond is present because of silicic acid contained in glass; therefore the transformation from the hydrogen bond to the covalent bond is smoothly conducted.

Furthermore, when heat treatment is conducted under the condition that the insulating layer and the holding substrate are attached to each other, movable ions start moving at the interface between the conductive layer and the supporting substrate by applying a DC voltage to the interface. Then, the insulating layer is easily bonded to the holding substrate by the electrostatic force of these ions, whereby a satisfactory bond can be formed at low temperature or for a short period of time.

By using the conductive layer provided on the single crystalline piezoelectric substrate as at least one electrode for applying an electric field to the single crystalline piezoelectric substrate, or by using the conductive layer as a terminal electrode connected to the electrode for applying an electric field to the single crystalline piezoelectric substrate, the degree of freedom of the arrangement of the electrode for applying an electric field and the terminal electrode is increased, via holes are not necessary, and hermetic sealing is easily conducted.

Furthermore, the second conductive layer and the second insulating layer are formed in this order on the holding substrate in the same way as in the single crystalline piezoelectric substrate. Then, the surface of the insulating layer on the single crystalline piezoelectric substrate and the second insulating layer to be bonded to the surface of the insulating layer are subjected to hydrophilic treatment and are heat-treated under the condition that the both surfaces are attached to each other. During this heat treatment, a DC voltage is applied between the conductive layer on the single crystalline piezoelectric substrate and the conductive layer on the holding substrate, whereby the bond is easily conducted by the electrostatic force of ions. In this construction, since an electric field with higher strength can be applied to the bonded interface, a satisfactory bond can be formed with ease at a low DC voltage.

Furthermore, by conducting direct bonding after completely burying the conductive layer two-dimensionally with the insulating layer and flattening the surface of the insulating layer, the airtightness at the directly bonded interface can be further increased.

After the formation of the conductive layer, a precursor of the insulating layer is coated in a solution state onto the conductive layer, dried, and heat-treated to form the insulating layer, whereby the step of flattening the surface of the insulating layer can be omitted.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing an electronic component, comprising the steps of:

patterning a single crystalline substrate;

forming a first patterned conductive layer over a first surface of the single crystalline substrate;

forming a second patterned conductive layer over a second surface of the single crystalline substrate, wherein the first and second patterned conductive layers correspond to one another at an oscillating portion of the electronic component, and wherein the first and second patterned conductive layers do not correspond to one another at a terminal electrode portion of the electronic component, thereby preventing the terminal electrode portion of the electronic component from adversely impacting the oscillation of the oscillation portion of the electronic component;

forming a first patterned insulating layer over the first patterned conductive layer and the first surface of the single crystalline substrate;

forming a second patterned insulating layer over the second patterned conductive layer and the second surface of the single crystalline substrate;

direct bonding a first holding substrate to the first patterned insulating layer; and direct bonding a second holding substrate to the second patterned insulating layer, wherein the first and second holding substrates enclose the electronic component, thereby hermetically sealing the electronic component.

2. A method for producing the electronic component of claim 1, wherein the steps of direct bonding the first and second patterned insulating layers comprises the step of conducting a heat treatment, thereby releasing hydrogen and increasing a bonding strength of the direct bonding.

3. A method for producing the electronic component of claim 2, wherein the step of conducting a heat treatment further comprises applying an electric field between the first patterned conductive layer and the first holding substrate and between the second patterned conductive layer and the s second holding substrate, respectively.

4. A method for producing the electronic component of claim 1, wherein the steps of forming the first and second patterned insulating layers comprises the step of flattening the first and second insulating layers.

5. A method for producing the electronic component of claim 1, wherein the steps of forming the first and second patterned insulating layers comprises the step of coating a solution-state precursor of an insulator onto the first and second patterned conductive layers and heat treating the precursor.

6. A method for producing an electronic component according to claim 5, wherein the solution-state precursor has a thickness greater than the first and second patterned conductive layers, thereby forming flat first and second patterned insulating layers overlying the first and second patterned conductive layers, respectively.

* * * * *

UNITED STATES PATENT AND TRADEMARK OFFICE
CERTIFICATE OF CORRECTION

PATENT NO. : 5,771,555
DATED : June 30, 1998
INVENTOR(S) : K. Eda et al.

It is certified that error appears in the above-identified patent and that said Letters Patent is hereby corrected as shown below:

On the cover page, item [56] References Cited, U.S. PATENT DOCUMENTS, insert "4,502,932, issued 3/1985 Kline et al.," and "5,185,589, issued 2/1993 Krishanaswamy et al."

On page 2, OTHER PUBLICATIONS, "Totoki, M. et al., 'Demonstration of Direct Bonding Between InP and Gadolinium Gallium Garnet ($Gd_3Ga_5O_{12}$) Substrates', Electronics Letters, vol. 30, No. 19," should read "Totoki, M. et al., 'Demonstration of Direct Bonding Between InP and Gadolinium Gallium Garnet ($Gd_3Ga_5O_{12}$) Substrates', Electronics Letters, vol. 30, No. 18,".

Column 16, claim 3, line 25, after "the" (second occurrence) delete "s".

Signed and Sealed this

Second Day of March, 1999

*Attest:*

Q. TODD DICKINSON

*Attesting Officer*     *Acting Commissioner of Patents and Trademarks*